(12) United States Patent
Chen et al.

(10) Patent No.: US 10,535,990 B2
(45) Date of Patent: Jan. 14, 2020

(54) POWER SUPPLY DEVICE, DETECTION CIRCUIT AND POWER SUPPLY METHOD THEREOF

(71) Applicant: Realtek Semiconductor Corporation, Hsinchu (TW)

(72) Inventors: Chien-Sheng Chen, Hsinchu County (TW); Jian-Ru Lin, Nantou County (TW); Chih-Cheng Lin, Hsinchu County (TW); Rui Wang, Jiangsu Province (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 359 days.

(21) Appl. No.: 15/583,994

(22) Filed: May 1, 2017

(65) Prior Publication Data

US 2018/0062377 A1 Mar. 1, 2018

(30) Foreign Application Priority Data

Aug. 30, 2016 (CN) .......................... 2016 1 0770234

(51) Int. Cl.
*H02H 3/26* (2006.01)
*H02H 3/02* (2006.01)
(Continued)

(52) U.S. Cl.
CPC ......... *H02H 3/26* (2013.01); *G01R 19/16576* (2013.01); *G06F 1/266* (2013.01);
(Continued)

(58) Field of Classification Search
CPC .......... H02H 3/26; H02H 11/00; H02H 3/025; G06F 1/266; G01R 19/16576; H04L 12/10; H04L 43/50
See application file for complete search history.

(56) References Cited

U.S. PATENT DOCUMENTS 8,097,982 B2 * 1/2012 Maggiolino ...... H04L 12/40045
307/85
8,782,442 B2 * 7/2014 Woo ........................ G06F 1/266
324/522

(Continued)

FOREIGN PATENT DOCUMENTS

CN 101989846 A 3/2011
CN 105594157 A 5/2016

*Primary Examiner* — Jared Fureman
*Assistant Examiner* — Michael J Warmflash
(74) *Attorney, Agent, or Firm* — CKC & Partners Co., LLC

(57) ABSTRACT

A power supply device includes a power supply circuit, a detection circuit, and a control circuit. The power supply circuit is configured to output a supply voltage. The detection circuit is configured to sequentially provide a first predetermined resistance and a second predetermined resistance according to a plurality of switching signals, in order to operate with an electronic device and the supply voltage to sequentially obtain a first detection voltage and a second detection voltage. The control circuit is configured to generate the switching signals, and determine a load resistance of the electronic device according to the first detection voltage and the second detection voltage. The control circuit is further configured to determine whether the load resistance is within a predetermined resistance range, and the power supply circuit is further configured to drive the electronic device if the load resistance is within the predetermined resistance range.

20 Claims, 6 Drawing Sheets

(51) Int. Cl.
  *G01R 19/165* (2006.01)
  *H02H 11/00* (2006.01)
  *G06F 1/26* (2006.01)
  *H04L 12/10* (2006.01)

(52) U.S. Cl.
  CPC ............ *H02H 3/025* (2013.01); *H02H 11/00* (2013.01); *H04L 12/10* (2013.01)

(56) References Cited

U.S. PATENT DOCUMENTS

| | | | |
|---|---|---|---|
| 2009/0085586 A1* | 4/2009 | Anderson | G01R 27/16 324/705 |
| 2012/0011380 A1* | 1/2012 | Dove | H04L 12/10 713/300 |
| 2014/0331066 A1* | 11/2014 | Chiu | G06F 1/266 713/300 |
| 2017/0012788 A1* | 1/2017 | Rimboim | H04L 12/10 |

* cited by examiner

POWER SUPPLY DEVICE, DETECTION CIRCUIT AND POWER SUPPLY METHOD THEREOF

RELATED APPLICATIONS

This application claims primly to China Application Serial Number, 201610770234.3, filed Aug. 30, 2016, which is herein incorporated by reference.

BACKGROUND

Technical Field

The present disclosure relates to a power supply system. More particularly, the present disclosure relates to a power supply device for supplying power over network and a power supply method thereof.

Description of Related Art

Power over Ethernet (POE) technology can transmit data and power required by network devices through network cables simultaneously. In some approaches, a power supply device provides different predetermined voltages to check whether a powered device is a valid network device. In such approaches, it is required to pay more attention on the compensation of system, in order to prevent a system oscillation. In addition, in such approaches, it is further required to provide additional short-circuit protection to prevent damage in the internal circuits.

SUMMARY

An aspect of the present disclosure is to provide a power supply device. The power supply device includes a power supply circuit, a detection circuit, and a control circuit. The power supply circuit is configured to output a supply voltage. The detection circuit is configured to sequentially provide a first predetermined resistance and a second predetermined resistance according to a plurality of switching signals, in order to operate with an electronic device and the supply voltage to sequentially obtain a first detection voltage and a second detection voltage. The control circuit is configured to generate the switching signals, and determine a load resistance of the electronic device according to the first detection voltage and the second detection voltage. The control circuit is further configured to determine whether the load resistance is within a predetermined resistance range, and the power supply circuit is further configured to drive the electronic device if the load resistance is within the predetermined resistance range.

The object and advantages of the embodiments will be realized and achieved at leash by the elements, features, and combinations particularly pointed out in the claims.

It is to be understood that both the foregoing general description and the following detailed description are merely examples and explanatory and are not restrictive of the invention, as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
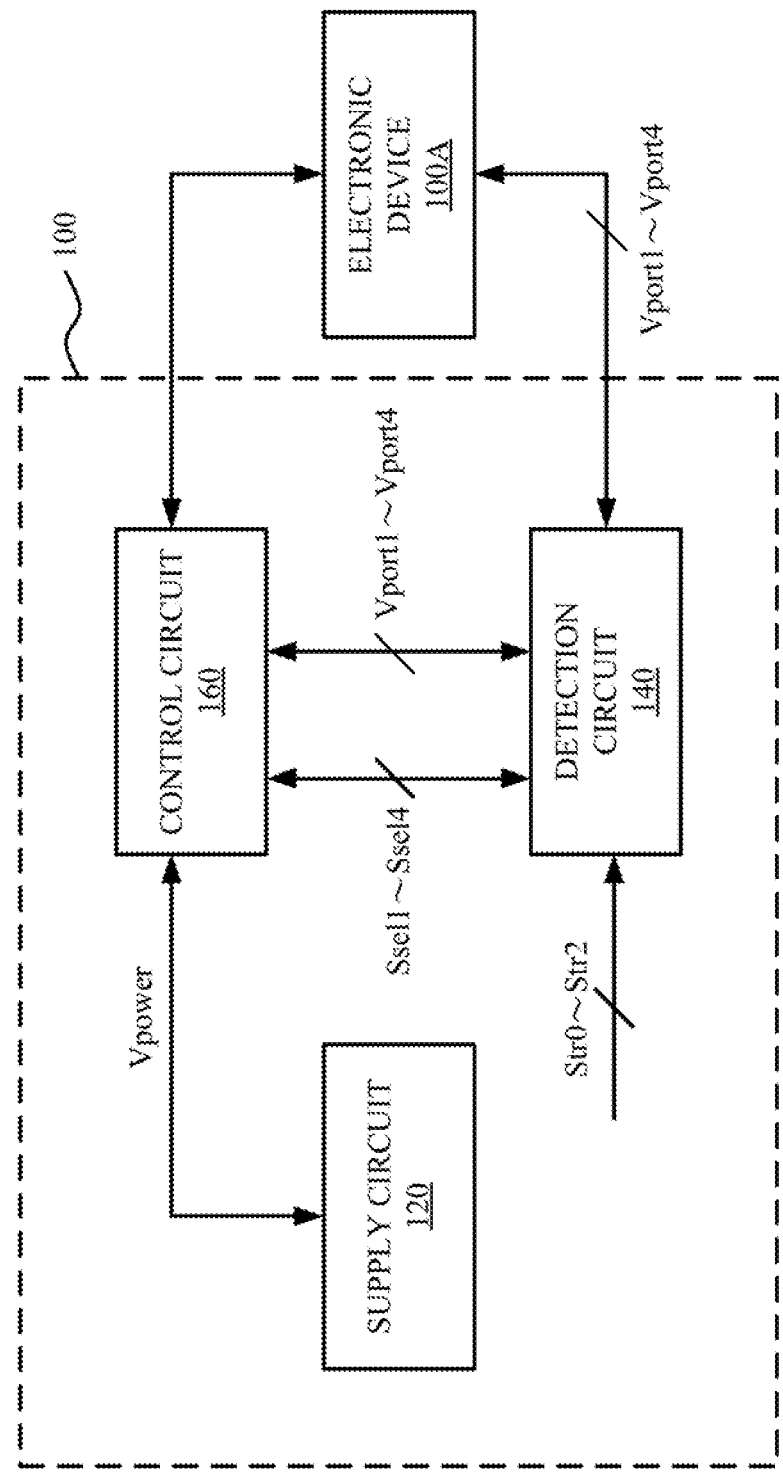
FIG. 1 is a schematic diagram of a power supply device, according to some embodiments of the present disclosure.

Reference is made to FIG. 1 which is a schematic diagram of a power supply device 100, according to some embodiments of the present disclosure. In some embodiments, the power supply device 100 and an external electronic device 100A are coupled with each other via network cables. In some embodiments, the network cables include Ethernet cables. In some embodiments, the external electronic device 100A includes various network devices including, for example, cameras, hubs, computers, etc. In some embodiments, the external electronic device 100A is referred to as a powered device.

In some embodiments, the power supply device 100 includes a power supply circuit 120, a detection circuit 140, and a control circuit 160. In some embodiments, the detection circuit 140 and the control circuit 160 can be implemented in power source equipment (PSE) in a power over Ethernet technology.

In some embodiments, the power supply circuit 120 provides a supply voltage Vpower. In various embodiments, the power supply circuit 120 can be implemented with various types of power converters. In some embodiments, the supply voltage Vpower is about 48 Volts. The above value of the supply voltage Vpower is given for illustrative purposes only. Various values of the supply voltage Vpower are within the contemplated scope of the present disclosure.

As shown in FIG. 1, the detection circuit 140 is coupled to the electronic device 100A. In some embodiments, the detection circuit 140 sequentially provides predetermined resistances according to switching signals Ssel1-Ssel4, in order to operate with the electronic device 100A to sequentially obtain detection voltages Vport1-Vport4. In some embodiments, the electronic device 100A has a load resistance Rpd (not shown). The supply voltage Vpower is divided by the predetermined resistances and the load resistance Rpd, in order to sequentially obtain the detection voltages Vport1-Vport4. The related descriptions will be given in the paragraphs below.

In some embodiments, the detection circuit 140 provides the predetermined resistances according to trimming signals Str0-Str2. For example, the detection circuit 140 is able to employ trimming circuits to adjust the predetermined resistances according to the trimming signals Str0-Str2.

With continued reference to FIG. 1, the control circuit 160 is coupled to the detection circuit 140 to receive the detection voltage Vport1-Vport4. In some embodiments, the control circuit 160 is implemented with one or more digital circuits. In some embodiments, the control circuit 160 is implemented with an internal controller of the PSE. The above implementations of the control circuit 160 are given for illustrative purposes only, and the present disclosure is not limited thereto.

In some embodiments, the control circuit 160 generates switching signals Ssel1-Ssel4, and determines the load resistance Rpd (not shown) of the electronic device 100A according to at least two of the detection voltages Vport1-Vport4. In some embodiments, if the load resistance Rpd is within a predetermined resistance range, the control circuit 160 further controls the power supply circuit 120 to drive the electronic device 100A.

For example, in some embodiments, for meeting an industry standard which includes, for example, IEEE 802.3A or later updated versions, the predetermined resistance range is set to be about 19-26.5 kilo-ohms. If the load resistance Rpd is within the predetermined resistance range, the control circuit 160 determines that the electronic device 100A is a valid network device. Accordingly, the control circuit 160 controls the power supply circuit 120 to drive the electronic device 100A. Alternatively, if the load resistance Rpd is not within the predetermined resistance range, the control circuit 160 determines that the electronic device 100A is an invalid network device. Under this condition, the control circuit 160 prohibits the power supply circuit 120 from driving the electronic device 100A, such that damages to circuitry in the electronic device 100A are prevented.

In some of her embodiments, the control circuit 160 obtains a transient time associated with one of the detection voltages Vport1-Vport4 while the detection circuit 140 sequentially provides the predetermined resistances, in order to determine a load capacitance Cpd of the electronic device 100A according to the transient time.

For example, when the detection circuit 140 provides a first predetermined resistance (e.g., resistance Rp1 below), the detection voltage Vport1 is generated. When the detection circuit 140 provides a second predetermined resistance (e.g., resistance Rp2 below), the detection voltage Vport2 is generated. As a result, the control circuit 160 can obtain the transient time for the detection voltage Vport1 being switched to the detection voltage Vport2. Accordingly, the control circuit 160 can calculate the load capacitance Cpd according to the transient time, the detection voltage Vport1, the detection voltage Vport2, and the load resistance Rp1. In some embodiments, the calculation of the load capacitance Cpd can be performed based on a basic principle of charging/discharging a capacitor, and unnecessary details are thus not given herein. The above operations of measuring and calculating the load capacitance Cpd are given for illustrative purposes only, and the present disclosure is not limited thereto.

Figure 2A:
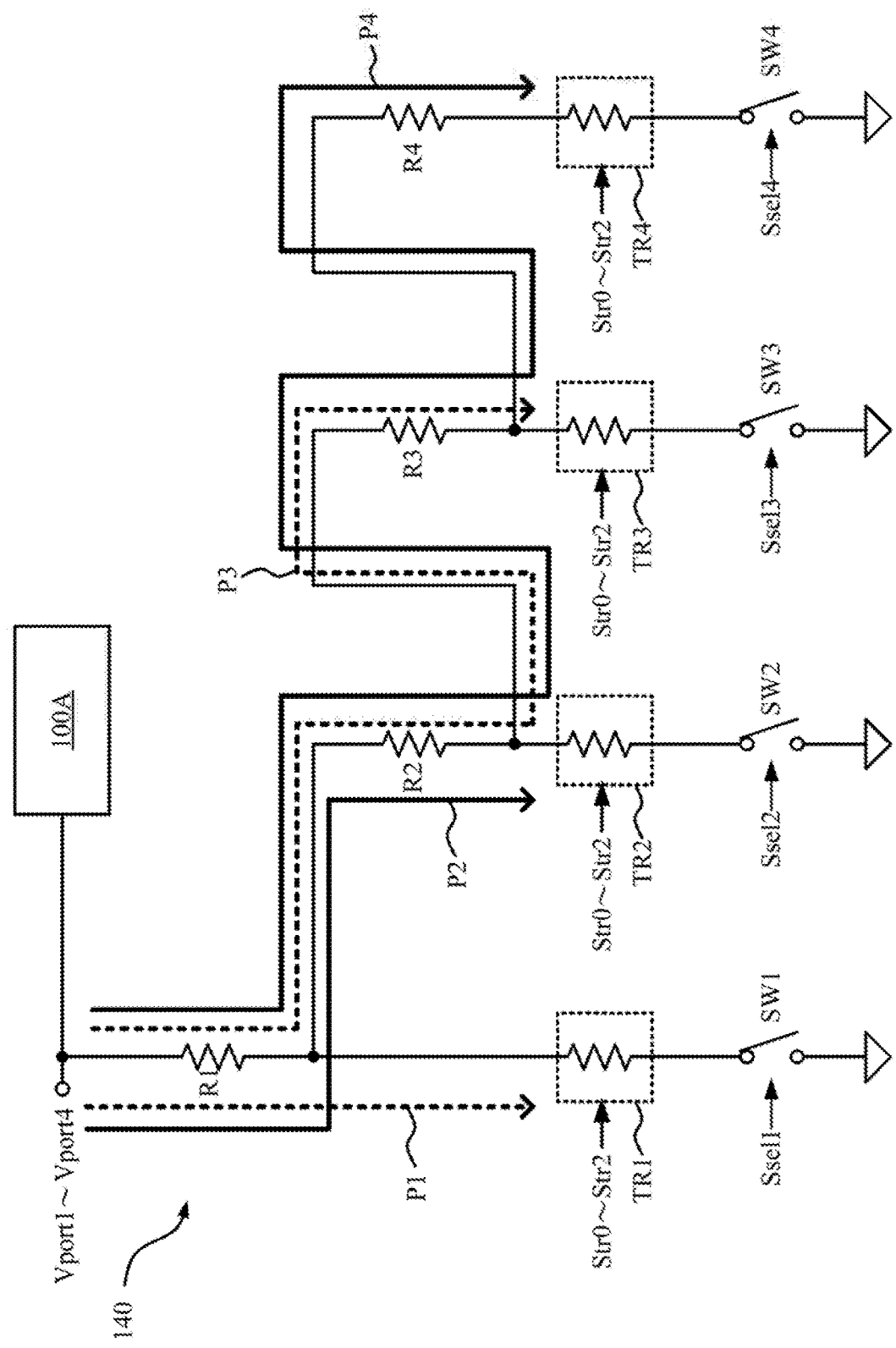
FIG. 2A is a circuit diagram of the detection circuit in FIG. 1, according to some embodiments of the present disclosure.

Reference is made to FIG. 2A which is a circuit diagram of the detection circuit 140 in FIG. 1, according to some embodiments of the present disclosure. With respect to FIG. 1, for ease of understanding, like elements in FIG. 2A are designated with the same reference numbers.

As shown in FIG. 2A, the detection circuit 140 is divided into four paths P1-P4. For simplicity, circuit arrangements for the previous two paths P1-P2 are discussed in the following paragraphs. Circuit arrangements for the rest paths P3-P4 can be understood with the same analogy, and the repetitious descriptions are thus not given here.

In some embodiments, the path P1 has a predetermined resistance Rp1. In some embodiments, the path P1 corresponds to a resistor R1, a trimming circuit TR1, and a switch SW1. The resistor R1 has a resistance Rr1, and a first terminal of the resistor R1 is coupled to the electronic device 100A, so as to sequentially obtain the detection voltages Vport1-Vport4. A first terminal of the trimming circuit TR1 is coupled to a second terminal of the resistor R1, and is configured to provide a trimmed resistance Rtr1 according to the trimming signals Str0-Str2.

In some embodiments, a sum of the resistance Rr1 and the trimmed resistance Rtr1 is configured to be the predetermined resistance Rp1. In general, the resistance Rp1 is configured to be about the same as the predetermined resistance Rp1. In practical applications, when an offset is present in the resistance Rr1 due to factors including, for example, process variation, the trimmed resistance Rtr1 is employed to correct the offset. Accordingly, a more accurate predetermined resistance Rp1 is provided. In other words, with the arrangement of the trimming circuit TR1, the predetermined resistance provided by the detection circuit 140 can be more accurate, and thus the accuracy of the detection is increased.

The switch SW1 is coupled between a second terminal of the trimming circuit TR1 and ground. The switch SW1 is turned on according to the switching signal Ssel1, such that the path P1 operates with the electronic device 100A to obtain the detection voltage Vport1.

With continued reference to FIG. 2A, the path P2 has a predetermined resistance Rp2. The path P2 corresponds to resistors R1-R2, a trimming circuit TR2, and a switch SW2. The resistor R2 has a resistance Rr2, and a first terminal of the resistor R2 is coupled to the second terminal of the resistor R1. A first terminal of the trimming circuit TR2 is coupled to a second terminal of the resistor R2, and is configured to provide a trimmed resistance Rtr2 according to the trimming signals Str0-Str2. In some embodiments, a sum of the resistances Rr1-Rr2 and the trimmed resistance Rtr2 is configured to be the predetermined resistance Rp2. The arrangements of the resistance Rp2 and the trimmed resistance Rtr2 are similar with the path P1, and thus the repetitious descriptions are not given here.

The switch SW2 is coupled between a second terminal of the trimming circuit TR2 and ground. The switch SW2 is configured to be turned on according to the switching signal Ssel2, such that the path P2 operates with the electronic device 100A to obtain the detection Vport2.

The path P3 corresponds to the resistors R1-R3, a trimming circuit TR3, and a switch SW3. The path P4 corresponds to the resistors R1-R4, a trimming circuit TR4, and a switch SW4. The arrangements of the paths P3-P4 are similar with the arrangements of the paths P1-P2 as discussed above, and thus the repetitious descriptions are not further given herein. With the arrangements above, the predetermined resistances Rp1-Rp4 of the paths P1-P4 are different from each other. As a result, the control circuit 160 is able to sequentially turn on the paths P1-P4 according to the switching signals Ssel1-Ssel4, in order to generate different detection voltages Vport1-Vport4 with the predetermined resistances Rp1-Rp4.

In some embodiments, in order to meet a predetermined industry standard, at least two of the predetermined resistance Rp1-Rp4 are utilized to make at least two of the detection voltages Vport1-Vport4 have a predetermined voltage difference therebetween, in which the at least two of the detection voltages Vport1-Vport4 are used to determine the load resistance Rpd. For example, when the control circuit 160 is configured to determine the load resistance Rpd according to the detection voltages Vport1 and Vport3, the predetermined resistances Rp1 and Rp3 are configured to have a predetermined voltage difference between the detection voltages Vport1 and Vport3. In some embodiments, the predetermined voltage difference is configured to be about 1

Volts. The above value of the predetermined voltage difference is given for illustrative purposes only. Various values of the predetermined voltage difference which are able to meet the industry standard are within the contemplated scope of the present disclosure.

Figure 2B:
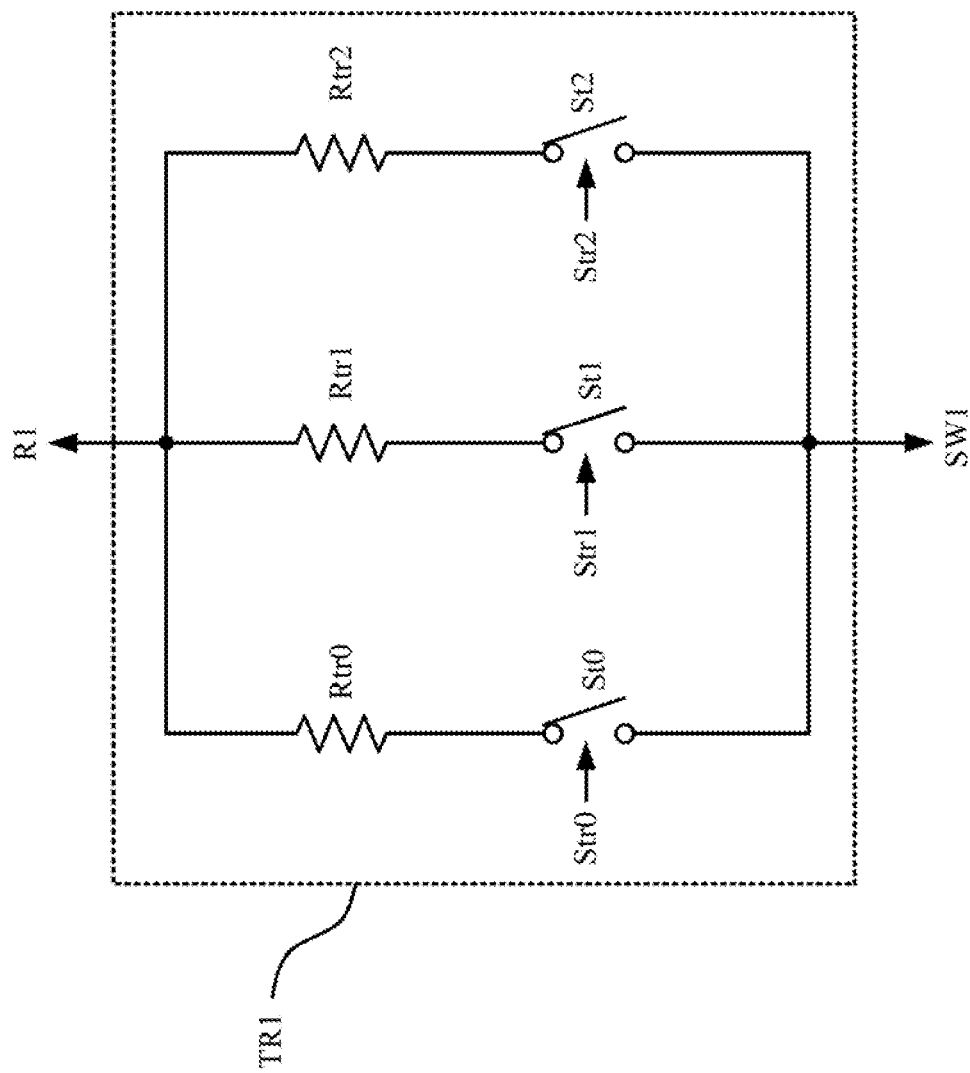
FIG. 2B is a circuit diagram of the trimming circuit in FIG. 2A, according to some embodiments of the present disclosure.

FIG. 2B is a circuit diagram of the trimming circuit TR1 in FIG. 2A, according to some embodiments of the present disclosure. With respect to FIG. 2A, like elements in FIG. 2B are designated with the same reference numbers for ease of understanding.

The trimming circuit TR1 includes trimming resistors Rtr0-Rtr2 and trimming switches St0-St2. The trimming resistors Rr0-Rtr2 are coupled between the second terminal of the resistor R1 in FIG. 2A and the trimming switches St0-St2. The trimming switches St0-St2 is coupled between the trimming resistors Rtr0-Rtr2 and the first terminal of the switch SW1 in FIG. 2A.

In some embodiments, each of the trimming switches St0-St2 is turned on according to a corresponding, one of the trimming signals Str0-Str2 When the trimming switches St0-St2 are turned on, the corresponding trimming resistors Rtr0-Rtr2 are coupled in parallel with each other, so as to generate different trimmed resistances. For example, when all of the trimming switches St0-St2 are turned on, all of the trimming resistors Rtr0-Rtr2 are coupled in parallel with each other to provide a lowest trimmed resistance. Alternatively, when only the trimming switch St0 is turned on, the trimming circuit Tr1 provides a highest trimmed resistance.

Figure 2C:
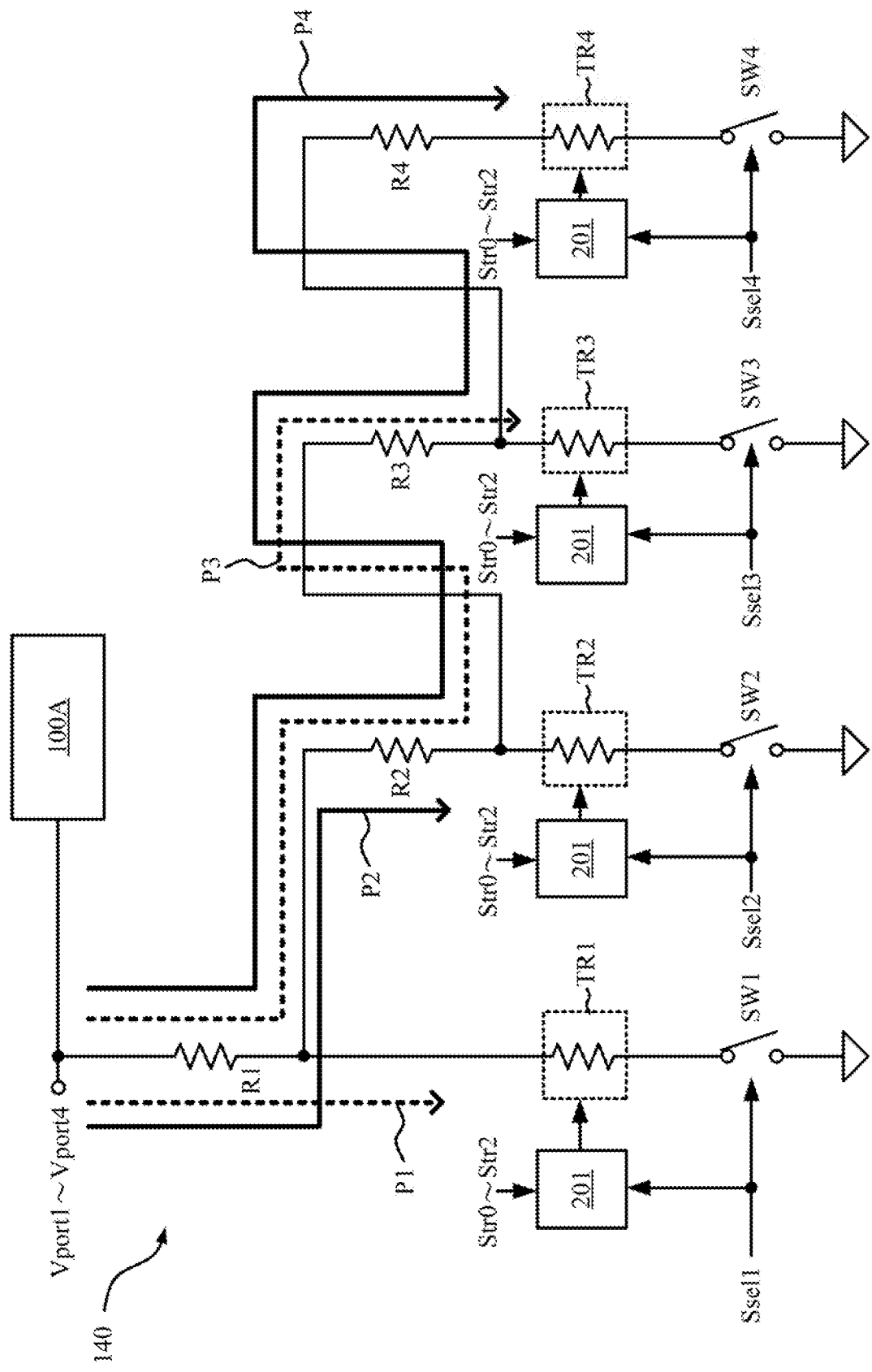
FIG. 2C is a circuit diagram of the detection circuit in FIG. 1, according to some embodiments of the present disclosure.

FIG. 2C is a circuit diagram of the detection circuit 140 in FIG. 1 according to some embodiments of the present disclosure. With respect to FIG. 2A, like elements in FIG. 2C are designated with the same reference numbers for ease of understanding.

In some other embodiments, compared with FIG. 2A, the detection circuit 140 in FIG. 2C further includes enabling circuits 201. The enabling circuits 201 are arranged corresponding to the paths P1-P4. For the path P1, when the switch SW1 is turned on, the enabling circuit 201 outputs the trimming signals Str0-Str2 to the trimming circuit 201 according to the switching signal Ssel1. For example, in some embodiments, the switch SW1 is turned on when the switching signal Ssel1 is at a high level. The enabling circuit 201 performs a logical "AND" operation on the switching signal Ssel1 and the trimming signals Str0-Str2, in order to output the corresponding trimming signals Str0-Str2 when the switching signal Ssel1 is at the high level.

The above descriptions are given, as an example only, with reference to the enabling circuit 201 to which the path P1 corresponds. The operations of the enabling circuits 201 to which the paths P2-P4 correspond can be understood with the same analogy, and thus the repetitious descriptions are not further given herein.

Figure 3:
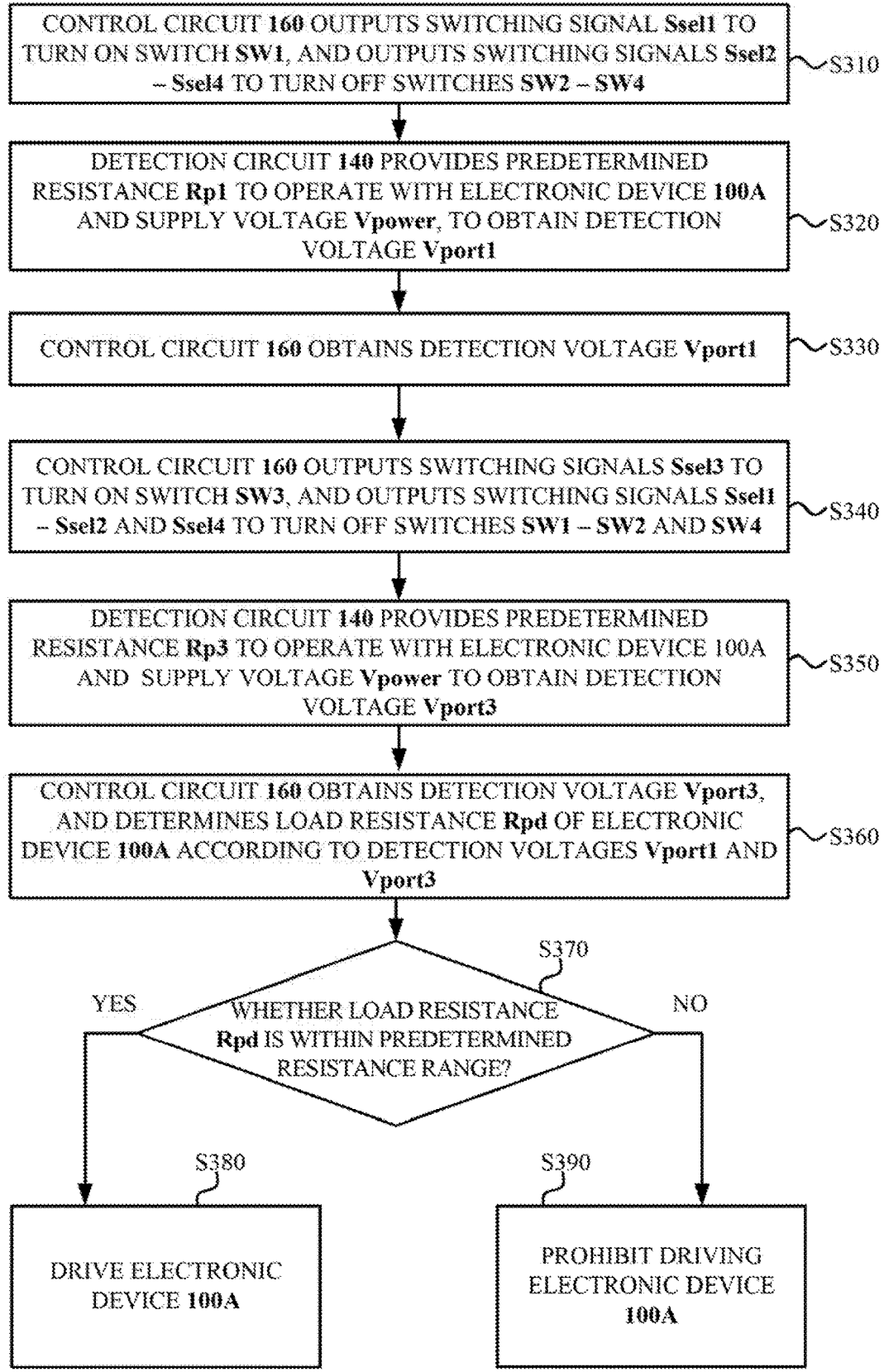
FIG. 3 is a flow chart of a power supply method, according to some embodiments of the present disclosure.

FIG. 3 is a flow chart of a power supply method 300, according to some embodiments of the present disclosure. In order to illustrate operations of the power supply device 100, reference is made to both FIG. 1, FIG. 2A, and FIG. 3.

In operation S310, the control circuit 160 outputs the switching signal Ssel1 to turn on the switch SW1, and outputs the switching signals Ssel2-Ssel4 to turn off the switches SW2-SW4.

In operation S320, the detection circuit 140 provides the predetermined resistance Rp1 to operate with the electronic device 100A and the supply voltage Vpower to obtain the detection voltage Vport1.

In operation S330, the control circuit 160 obtains the detection voltage Vport1.

In operation S340, the control circuit 160 outputs the switching signals Ssel3 to turn on the switch SW3, and outputs the switching signals Ssel1-Ssel2 and Ssel4 to turn off the switches SW1-SW2 and SW4.

In operation S350 the detection circuit 140 provides the predetermined resistance Rp3 to operate with the electronic device 100A and the supply voltage Vpower to obtain the detection voltage Vport3.

In operation S360, the control circuit 160 obtains the detection voltage Vport3, and determines the load resistance Rpd of the electronic device 100A according to the detection voltages Vport1 and Vport3.

In operation S370, the control circuit 160 determines whether the load resistance Rpd is within the predetermined resistance range. If yes, operation S380 is performed. Otherwise, operation S390 is performed.

In operation S380, the control circuit 180 controls the power supply circuit 120 to drive the electronic device 100A. In operation S390, the control circuit 160 prohibits the power supply circuit 120 from driving the electronic device 100A.

The above description of the power supply method 300 includes exemplary operations, but the operations of the power supply method 300 are not necessarily performed in the order described. The order of the operations of the power supply method 300 disclosed in the present disclosure are able to be changed, or the operations are able to be executed simultaneously or partially simultaneously as appropriate, in accordance with the spirit and scope of various embodiments of the present disclosure.

Figure 4:
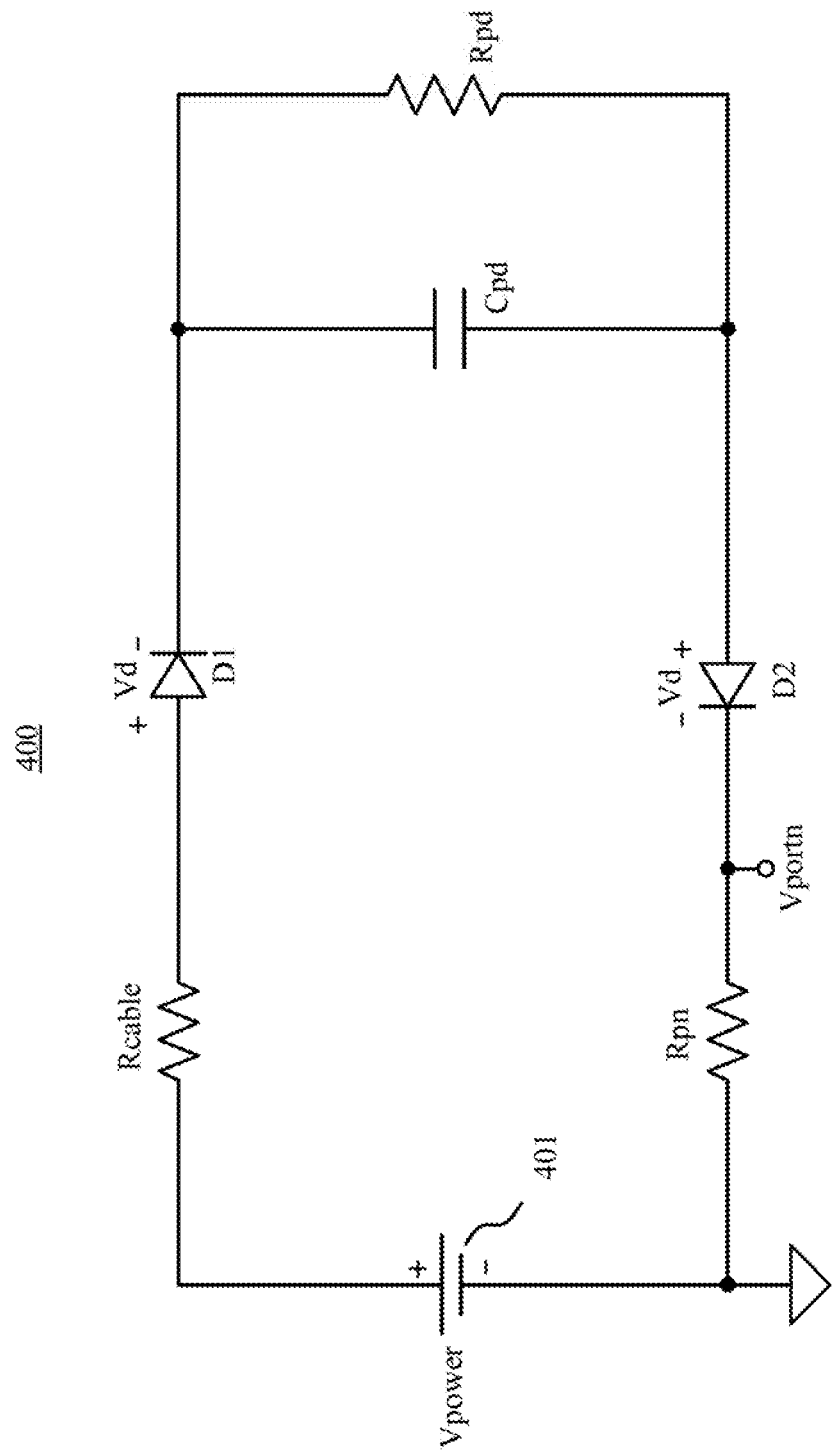
FIG. 4 is a schematic diagram a partial equivalent circuit of the power supply device 100 and the electronic device in FIG. 1, according to some embodiments of the present disclosure.

FIG. 4 is a schematic diagram of a partial equivalent circuit 400 of the power supply device 100 and the electronic device 100A in FIG. 1, according to some embodiments of the present disclosure.

Reference is made to FIG. 1, FIG. 3, and FIG. 4, in order to illustrate operation S360 in FIG. 3. As shown in FIG. 4, Rcable indicates a wire resistance of the network cables, Cpd indicates a load capacitance of the electronic device 100A and D1-D2 indicates intrinsic diodes of the electronic device 100A. The power source 401 indicates the supply voltage Vpower FIG. 1, and Rpn indicates the predetermined resistance provided by the detection circuit 140 in FIG. 2A, which is, as discussed above, sequentially switched by the control circuit 160.

In operation S320, the detection circuit 140 provides the predetermined resistance Rp1 to operate with the electronic device 100A and the supply voltage Vpower to obtain the detection voltage Vport1. Under this condition, the following equation (1) can be derived from the equivalent circuit 400:

$$Vport1 = \frac{Vpower - 2 \times Vd}{Rpd + Rcable + Rp1} \times Rp1 \quad (1)$$

where Vd indicates a voltage drop across the internal diodes D1-D2.

Similarly, in operation S350, the detection circuit 140 provides the predetermined resistance Rp3 to operate with the electronic device 100A and the supply voltage Vpower to obtain the detection voltage Vport3. Under this condition, the following equation (4) can be derived from the equivalent circuit 400:

$$Vport3 = \frac{Vpower - 2 \times Vd}{Rpd + Rcable + Rp3} \times Rp3 \quad (2)$$

The control circuit 160 can perform the calculation based on the equations (1) and (2), in order to determine the load resistance Rpd. For example, if the wire resistance Rcable is much less than other resistances, the following equation (3) can be derived from the equations (1) and (2):

$$Vport1 \times (Rpd + Rp1) \times Rp3 = \quad (3)$$

$$Vport3 \times (Rpd + Rp3) \times Rp1 \rightarrow Vport1 \times \left(\frac{Rpd}{Rp1} \times 1\right) =$$

$$Vport3 \times \left(\frac{Rpd}{Rp3} + 1\right) \rightarrow Rpd = \frac{Vport3 - Vport1}{\frac{Vport1}{Rp1} - \frac{Vport3}{Rp3}}$$

where the values of the predetermined resistance Rp1 and Rp3 are known. In some embodiments, the values of the predetermined resistance Rp1-Rp4 can be stored in or inputted to the control circuit 160, in order to determine the load resistance Rpd via the equation (3). The above calculations of the load resistance Rpd are given for illustrative purposes only, and the present disclosure is not limited thereto.

The numbers of the paths P1-P4 or the trimming resistors Rtr0-Rtr2 in various embodiments are given for illustrative purposes only. Two or more paths and two or more trimming resistors are within the contemplated scope of the present disclosure. In some embodiments, as the detection circuit 140 detects the load resistance Rpd through the different predetermined resistances, the predetermined resistances provides a current limiting function to the power supply device 100. Effectively, the detection circuit 140 can be configured to provide a short-circuit protecton to the power supply device 100.

In some embodiments, the detection circuit 140 also can be utilized to detect an open-circuit in the ever supply device 100. For example, if the electronic device 100A is not connected to the power supply device 100 (i.e., an open circuit status), the detection voltages Vport1-Vportn will be gradually varied rattle than being at a fixed value while the predetermined resistances Rp1-Rp4 are switched. Accordingly, when such a situation is detected, the control circuit 160 can determine that an open-circuit is present in the power supply device 100.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power supply device, comprising:
   a power supply circuit configured to output a supply voltage;
   a detection circuit configured to sequentially provide a first predetermined resistance and a second predetermined resistance according to a plurality of switching signals, in order to operate with an electronic device and the supply voltage to sequentially obtain a first detection voltage and a second detection voltage; and
   a control circuit configured to generate the switching signals, and determine a load resistance of the electronic device according to the first detection voltage and the second detection voltage,
   wherein the control circuit is further configured to determine whether the load resistance is within a predetermined resistance range, and the power supply circuit is further configured to drive the electronic device if the load resistance is within the predetermined resistance range.

2. The power supply device of claim 1, wherein the detection circuit comprises:
   a first resistor having a first resistance and coupled to the electronic device;
   a first trimming circuit coupled to the first resistor, and configured to generate a first trimmed resistance according a plurality of trimming signals, wherein a sum of the first resistance and the first trimmed resistance is the first predetermined resistance; and
   a first switch coupled between the first trimming circuit and ground, and configured to be turned on according to a first switching signal of the switching signals, in order to obtain the first detection voltage.

3. The power supply device of claim 2, wherein the detection circuit further comprises:
   a second resistor having a second resistance, and coupled to the first resistor;
   a second trimming circuit coupled to the second resistor, and configured to generate a second trimmed resistance according to the trimming signals, wherein a sum of the first resistance, the second resistance, and the second trimmed resistance is the second predetermined resistance; and
   a second switch coupled between the second trimming circuit and the ground, and configured to be turned on according to a second switching signal of the switching signals, in order to obtain the second detection voltage.

4. The power supply device of claim 2, wherein the first trimming circuit comprises:
   a plurality of trimming resistors coupled to the first resistor; and
   a plurality of trimming switches coupled between the trimming resistors and the first switch, and configured to be turned on according to the trimming signals.

5. The power supply device of claim 2, wherein the detection circuit further comprises:
   an enabling circuit configured to output the trimming signals if the first switch is turned on.

6. The power supply device of claim 5, wherein the enabling circuit is configured to perform a logical operation based on the first switching signal and the trimming signals, in order to output the trimming signals if the first switching signal is at a predetermined level.

7. The power supply device of claim 1, wherein the first predetermined resistance and the second predetermined resistance are configured to introduce a predetermined voltage difference between the first detection voltage and the second detection voltage.

8. The power supply device of claim 1, wherein the control circuit is further configured to obtain a transient time associated with the second detection voltage, in order to calculate a load capacitance of the electronic device,
   wherein the control circuit is further configured to determine whether the load capacitance is within a predetermined capacitance range, and the power supply circuit is configured to drive the electronic device if the load capacitance is within the predetermined capacitance range.

9. The power supply device of claim 1, wherein the detection circuit is further configured to provide a short-circuit protection.

10. A detection circuit, comprising:
- an output terminal coupled to an electronic device and configured to generate a detection voltage;
- a first resistor coupled to the output terminal;
- a first path configured to generate a first trimmed resistance in response to a first switching signal and a plurality of trimming signals, in order to operate with the first resistor to provide a first predetermined resistance to the output terminal; and
- a second path configured to generate a second trimmed resistance in response to a second switching signal and the trimming signals, in order to operate with the first resistor to provide a second predetermined resistance to the output terminal.

11. The detection circuit of claim 10, wherein the first path comprises:
- a first trimming circuit coupled to the first resistor, and configured to generate the first trimmed resistance according to the trimming signals, wherein a sum of a resistance of the first resistor and the first trimmed resistance is the first predetermined resistance; and
- a first switch coupled between the first trimming circuit and ground, and configured to be turned on according to the first switching signal.

12. The detection circuit of claim 11, wherein the first trimming circuit comprises:
- a plurality of trimming resistors coupled to the first resistor; and
- a plurality of trimming switches coupled between the trimming resistors and the first switch, and configured to be turned on according to the trimming signals.

13. The detection circuit of claim 12, further comprising:
- an enabling circuit configured to output the trimming signals if the first switch is turned on.

14. The detection circuit of claim 13, wherein the enabling circuit is configured to perform a logical operation based on the first switching signal and the trimming signals, in order to output the trimming signals if the first switching signal is at a predetermined level.

15. The detection circuit of claim 10, wherein the second path comprises:
- a second resistor coupled to the first resistor;
- a second trimming circuit coupled to the second resistor, and configured to generate the second trimmed resistance according to the trimming signals, wherein a sum of a resistance of the first resistor, a resistance of the second resistor, and the second trimmed resistance is the second predetermined resistance; and
- a second switch coupled between the second trimming circuit and ground, and configured to be turned on according to the second switching signal.

16. A power supply method, comprising:
- sequentially providing a first predetermined resistance and a second predetermined resistance according to a plurality of switching signals, in order to operate with an electronic device and a supply voltage to sequentially obtain a first detection voltage and a second detection voltage;
- determining a load resistance of the electronic device according to the first detection voltage and the second detection voltage; and
- driving the electronic device if the load resistance is within a predetermined resistance range.

17. The power supply method of claim 16, wherein generating the first detection voltage and the second detection voltage comprises:
- generating a first trimmed resistance according to a plurality of trimming signals, in order to operate with a first resistor to provide the first predetermined resistance, wherein a sum of the first trimmed resistance and a resistance value of the first resistor is the first predetermined resistance; and
- operating with the electronic device and the supply voltage according to a first switching signal of the switching signals to obtain the first detection voltage.

18. The power supply method of claim 17, further comprising:
- generating a second trimmed resistance according to the trimming signals, in order to operate with the first resistor and a second resistor to provide the second predetermined resistance, wherein a sum of second trimmed resistance, a resistance of the first resistor, and a resistance of the second resistor is the second predetermined resistance; and
- operating with the electronic device and the supply voltage according to a second switching signal of the switching signals, in order to obtain the second detection voltage.

19. The power supply method of claim 17, further comprising:
- outputting the trimming signals according to the first switching signal.

20. The power supply method of claim 16, further comprising:
- obtaining a transient time associated with the second detection voltage to determine a load capacitance of the electronic device; and
- driving the electronic device if the load capacitance is within a predetermined capacitance range.

* * * * *